United States Patent
Seo et al.

(10) Patent No.: US 8,324,650 B2
(45) Date of Patent: Dec. 4, 2012

(54) LIGHT EMITTING DEVICE AND METHOD OF FABRICATING THE SAME

(75) Inventors: Won Cheol Seo, Ansan-si (KR); Sum Geun Lee, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/240,501

(22) Filed: Sep. 22, 2011

(65) Prior Publication Data

US 2012/0007044 A1     Jan. 12, 2012

Related U.S. Application Data

(63) Continuation of application No. 12/950,676, filed on Nov. 19, 2010.

(30) Foreign Application Priority Data

Dec. 31, 2009   (KR) .................. 10-2009-0135309

(51) Int. Cl.
*H01L 33/00* (2010.01)
(52) U.S. Cl. .................. 257/98; 257/99; 257/100
(58) Field of Classification Search ............ 257/98–100
See application file for complete search history.

(56) References Cited

U.S. PATENT DOCUMENTS

| | | | |
|---|---|---|---|
| 2006/0231852 A1* | 10/2006 | Kususe et al. .................. 257/99 |
| 2009/0065800 A1 | 3/2009 | Wirth et al. | |
| 2010/0171135 A1 | 7/2010 | Engl et al. | |
| 2011/0049555 A1 | 3/2011 | Engl et al. | |
| 2012/0086026 A1 | 4/2012 | Engl et al. | |

FOREIGN PATENT DOCUMENTS

| | | |
|---|---|---|
| DE | 102007022947 | 10/2008 |
| DE | 102008011848 | 9/2009 |
| DE | 102008032318 | 10/2009 |
| EP | 2 290 689 | 3/2011 |
| JP | 2004047504 | 2/2004 |
| KR | 10-0599012 | 7/2006 |
| WO | 2004/023568 | 3/2004 |
| WO | 2005081319 | 9/2005 |
| WO | 2009106063 | 9/2009 |

OTHER PUBLICATIONS

Extended European Search Report dated Apr. 28, 2011 in European Patent Application No. 10-188 088.8.
Extended European Search Report dated Apr. 23, 2012 for EP 12 15 4396.

(Continued)

*Primary Examiner* — Samuel Gebremariam
(74) *Attorney, Agent, or Firm* — H.C. Park & Associates, PLC

(57) ABSTRACT

Disclosed are a light emitting device and a method of fabricating the same. The light emitting device includes a substrate; first and second light emitting cells, each including a first semiconductor layer, an active layer, and a second semiconductor layer; and a connector located between the first and second light emitting cells and the substrate, to electrically connect the first and second light emitting cells to each other. The connector extends from the second semiconductor layer of the first light emitting cell, across the substrate, and through central regions of the second semiconductor layer and active layer of the second light emitting cells, to contact the first semiconductor layer of the second light emitting cell.

20 Claims, 4 Drawing Sheets

OTHER PUBLICATIONS

Non-Final Office Action issued for related U.S. Appl. No. 12/950,676 dated Mar. 16, 2012.
Non-Final Office Action issued for related U.S. Appl. No. 13/077,395 dated Apr. 4, 2012.
Notice of Allowance issued on Jun. 27, 2012 in U.S. Appl. No. 13/077,395.
Notice of Allowance issued on Jun. 26, 2012 in U.S. Appl. No. 12/950,676.

* cited by examiner

PRIOR ART

LIGHT EMITTING DEVICE AND METHOD OF FABRICATING THE SAME

CROSS-REFERENCE TO RELATED APPLICATION

This application is a continuation of U.S. patent application Ser. No. 12/950,676, filed on Nov. 19, 2010, and claims priority from and the benefit of Korean Patent Application No. 10-2009-0135309, filed on Dec. 31, 2009, which is hereby incorporated by reference for all purposes as if fully set forth herein.

BACKGROUND OF THE INVENTION

1. Field of the Invention

The present disclosure relates to a light emitting device and a method of fabricating the same.

2. Description of the Background

A light emitting diode refers to a semiconductor device that has a p-n semiconductor junction, which emits light through electron-hole recombination. Such light emitting diodes are used in a wide range of applications, such as display devices, backlights, etc. Furthermore, light emitting diodes have a lower power consumption and longer lifetime than existing electric bulbs and fluorescent lamps. Thus, light emitting diodes are being implemented as a substitute for existing electric bulbs and fluorescent lamps used in general illumination.

In recent years, AC light emitting diodes, which are directly connected to an AC power source to continuously emit light, have been produced. One example of AC light emitting diodes that are directly connected to a high voltage AC power source is disclosed in PCT Publication No. WO 2004/023568 (A1), entitled "Light emitting device having light emitting elements" by Sakai et al.

According to PCT Publication No. WO 2004/023568 A1, LED elements are two-dimensionally connected in series, on an insulation substrate, such as a sapphire substrate, to form LED arrays. Such LED arrays are connected to each other, thereby providing a light emitting device that can be operated at high voltage. Further, such LED arrays are connected in reverse parallel to each other, on the sapphire substrate, thereby providing a single-chip light emitting device that can be operated by an AC power supply.

Since the AC-LED includes light emitting cells formed on the substrate, which is used as a growth substrate, there are limitations to the structure of the light emitting cells and the light extraction efficiency thereof. To solve such problems, a method of fabricating an AC-LED, through a substrate lift-off process, is disclosed in Korean Patent No. 10-0599012, entitled "Light emitting diode employing thermally conductive substrate and method of fabricating the same."

FIGS. 1 to 4 are cross-sectional views illustrating a conventional method of fabricating a light emitting device. Referring to FIG. 1, semiconductor layers, including a buffer layer 23, an N-type semiconductor layer 25, an active layer 27, and a P-type semiconductor layer 29, are formed on a sacrificial substrate 21. Further, a first metal layer 31 is formed on the semiconductor layers, and a second metal layer 53 is formed on a substrate 51 separate from the sacrificial substrate 21. The first metal layer 31 may include a reflective metal layer. The second metal layer 53 is bonded to the first metal layer 31, so that the substrate 51 is bonded to an upper portion of the semiconductor layers.

Referring to FIG. 2, after bonding the substrate 51, the sacrificial substrate 21 is removed using a laser lift-off process. Further, after the sacrificial substrate 21 is removed, the remaining buffer layer 23 is removed, and the surface of the N-type semiconductor layer 25 is exposed.

Referring to FIG. 3, the semiconductor layers 25, 27, 29 and the metal layers 31, 53 are subjected to a patterning process, using photolithography and etching technologies, to form separate metal patterns 40 and light emitting cells 30 located on the metal patterns 40. Each of the light emitting cells 30 includes a P-type semiconductor layer 29a, an active layer 27a, and an N-type semiconductor layer 25a, which are subjected to patterning.

Referring to FIG. 4, metal wires 57 are formed to electrically connect upper surfaces of the light emitting cells 30 to the metal patterns 40 adjacent thereto. The metal wires 57 connect the light emitting cells 30 to each other, to form series arrays of the light emitting cells. In order to connect the metal wires 57 to the light emitting cells, electrode pads 55 may be formed on the N-type semiconductor layers 25a, and electrode pads may also be formed on the metal patterns 40. Two or more series arrays may be formed and connected in reverse parallel to each other, thereby providing a light emitting diode that can be driven by an AC power source.

As such, the conventional method can improve the heat dissipation of the light emitting device, through appropriate selection of the substrate 51, and can enhance a light extraction efficiency via treatment of the surface of the N-type semiconductor layer 25a. Further, since the first metal layer 31a includes the reflective metal layer to reflect light radiated from the light emitting cells 30 towards the substrate 51, the luminous efficiency may be further improved.

However, such a conventional method may cause a short circuit between the N-type semiconductor layer 25a and the P-type semiconductor layer 29a, due to the adhesion of metallic etching by-products to sidewalls of the light emitting cells 30, during the patterning of the semiconductor layers 25, 27, 29 and the metal layers 31, 53. Further, when etching the semiconductor layers 25, 27, 29, the surface of the first metal layer 31a is exposed and is likely to be damaged by plasma. When the first metal layer 31a includes a Ag or Al reflective metal layer, such etching damage is more pronounced. The plasma damage to the surface of the metal layer 31a deteriorates the contact between the wires 57 or electrode pads, and the metal layer, thereby increasing device failure rates.

In the conventional method, the first metal layer 31 may include the reflective metal layer and thus, may reflect light from the light emitting cells 30 away from the substrate. However, the reflective metal layer is disposed in a space between the light emitting cells 30 and thus, is frequently damaged by etching and/or oxidation, reducing the reflectivity thereof. Furthermore, since the substrate 51 is exposed between the metal patterns 40, light can be absorbed by the substrate 51, thereby causing optical loss. Moreover, since the wires 57 are connected to an upper light emitting surface of the N-type semiconductor layer 25a, light produced by the active layer 25a can be absorbed by the wires 57 and/or the electrode pads 55 located on the light emitting surface, thereby increasing optical loss.

SUMMARY OF THE INVENTION

Exemplary embodiments of the invention provide a light emitting device for high voltage operations that may prevent electric short circuits in light emitting cells, due to metallic etching by-products, and a method of fabricating the same.

Further exemplary embodiments of the invention provide a light emitting device that may reduce the loss of light directed towards a substrate, in a space between light emitting cells, and a method of fabricating the same.

Further exemplary embodiments of the invention provide a light emitting device that may reduce the loss of light emitted from a light emitting surface, to improve overall luminous efficiency, and a method of fabricating the same.

Further exemplary embodiments of the invention provide a light emitting device that may assist current spreading in light emitting cells, and a method of fabricating the same.

Additional features of the invention will be set forth in the description which follows, and in part will be apparent from the description, or may be learned by practice of the invention.

An exemplary embodiment of the present invention discloses a light emitting device. The light emitting device includes: a substrate; first and second light emitting cells, each including a first semiconductor layer, an active layer, a second semiconductor layer, and a hole formed through the second semiconductor layer and the active layer, to expose the first semiconductor layer; and a connector located between the first and second light emitting cells and the substrate, electrically connecting the first and second light emitting cells to each other. The holes may be located at central regions of the first and second light emitting cells, respectively, and the connector may electrically connect the second semiconductor layer of the first light emitting cell to the portion of the first semiconductor layer exposed that is through the hole of the second light emitting cell.

Since the connector is located between the substrate and the light emitting cells, it is possible to prevent the loss of light due to the connector. Further, since the holes are located at the central regions of the light emitting cells, the connector can be connected to the first semiconductor layers, at the central regions, thereby allowing current spreading over a wide area of the light emitting cells.

Furthermore, each of the first and second light emitting cells may include a single hole that exposes the first semiconductor layer, but is not limited thereto. Alternatively, each of the first and second light emitting cells may include a plurality of holes.

According to some embodiments, the light emitting device may further include an isolation trench isolating the light emitting cells from each other, and an insulation layer interposed between the isolation trench and the connector. When etching the semiconductor layers to form the isolation trench, the insulation layer covers the connector, to protect the connector from etching damage.

According to some embodiments, the insulation layer may include a distributed Bragg reflector (DBR). Accordingly, it is possible to reflect light, which is radiated from a region between the light emitting cells towards the substrate, thereby further enhancing the luminous efficiency.

According to some embodiments, the isolation trench may be formed through the first semiconductor layer, active layer, and second semiconductor layer. Namely, the isolation trench may be formed by etching the first semiconductor layer, active layer, and second semiconductor layer, thereby simplifying the process of forming the light emitting cells.

According to some embodiments, the light emitting device may further include an insulation layer covering a sidewall of the holes. The insulation layer prevents the connector from short circuiting the first semiconductor layer and the second semiconductor layer. Furthermore, the insulation layer may include a DBR. Accordingly, it is possible to prevent light produced in the light emitting cells from being absorbed and lost by the connector, in the hole.

In some embodiments, the light emitting device may further include an ohmic contact layer that contacts the second semiconductor layer of each of the light emitting cells. Here, the connector is insulated from the ohmic contact layer of the second light emitting cell, while being connected to the ohmic contact layer of the first light emitting cell. In some embodiments, an insulation layer may be interposed between the ohmic contact layer of the second light emitting cell and the connector, so that the connector may be insulated from the ohmic contact layer via the insulation layer.

According to some embodiments, a DBR may be interposed between the ohmic contact layer and the semiconductor layer. Here, the DBR may include through-holes, through which the ohmic contact layer may be connected to the second semiconductor layer.

According to some embodiments, an isolation insulation layer may be interposed between the connector and the substrate. The isolation insulation layer prevents electrical short circuits, by isolating the bonding metal from the connector.

Another exemplary embodiment of the present invention discloses a light emitting device including: a substrate; a first light emitting cell including a first semiconductor layer, an active layer, a second semiconductor layer, and a hole formed through the second semiconductor layer and the active layer, to expose the semiconductor layer; a first connector electrically connected to the first semiconductor layer, through the hole; and a second connector electrically connected to the second semiconductor layer. The hole may be located at a central region of the light emitting cell, and the first connector may be electrically insulated from the second semiconductor layer. As such, the first and second connectors are disposed between the light emitting cells and the substrate, to prevent optical loss, and the second connector is connected to the central region of the light emitting cell, to enhance current spreading in the light emitting cell.

According to some embodiments, the first light emitting cell may include a plurality of holes exposing the first semiconductor layer.

According to some embodiments, an insulation layer may be formed on a sidewall of the hole. The insulation layer prevents the second connector from short circuiting the first semiconductor layer and the second semiconductor layer. The insulation layer may include a DBR, thereby preventing light produced in the first light emitting cell from being absorbed by the second connector.

In some embodiments, the light emitting cell may further include an ohmic contact layer that contacts the second semiconductor layer. The second connector may be connected to the ohmic contact layer. Furthermore, the ohmic contact layer may include a reflective metal layer to reflect light produced in the first light emitting cell, away from the substrate.

According to some embodiments, an insulation layer may be interposed between the first connector and the ohmic contact layer. As a result, the first connector may be insulated from the ohmic contact layer, via the insulation layer. The insulation layer may include a DBR.

The light emitting device may further include a second light emitting cell including a first semiconductor layer, an active layer, and a second semiconductor layer. The second connector may be electrically connected to the first semiconductor layer of the second light emitting cell.

In some embodiments, the second light emitting cell may include a hole formed through the semiconductor layer and the active layer, to expose the first semiconductor layer. The second connector may be electrically connected to the first semiconductor layer of the second light emitting cell, through the hole.

According to some embodiments, the first and second light emitting cells may be isolated from each other by an isolation trench, and an insulation layer may be interposed between the isolation trench and the second connector. The insulation layer may include a DBR.

As such, the exemplary embodiments of the present invention provide light emitting devices for high voltage operations, which can prevent electrical short circuits in light emitting cells, by preventing metallic etching by-products from being produced. Further, the light emitting device employs an insulation layer including a DBR to reflect light away from the substrate, thereby enhancing the luminous efficiency thereof. In addition, connectors connecting the light emitting cells are buried in the light emitting device, thereby preventing light emitted from a light emitting surface from being absorbed by the connectors. Further, the light emitting cells have holed formed at the central regions thereof, through which the connectors are connected to the first semiconductor layers, to assist current spreading in the light emitting cells.

It is to be understood that both the foregoing general description and the following detailed description are exemplary and explanatory, and are intended to provide further explanation of the invention, as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain various aspects of the invention.

DETAILED DESCRIPTION

Figure 1:
FIGS. 1, 2, 3, and 4 are cross-sectional views illustrating a conventional method of fabricating a light emitting device.
Figure 1:
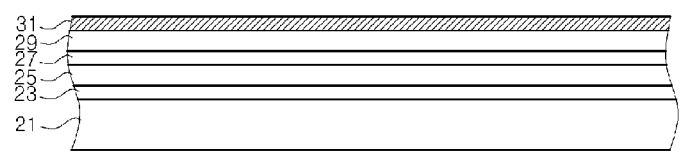
Figure 2:
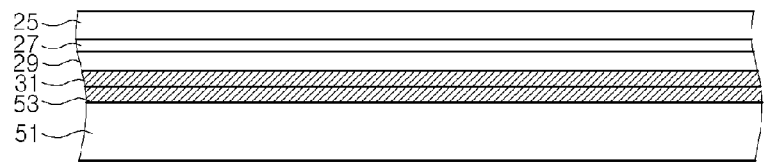
Figure 3:
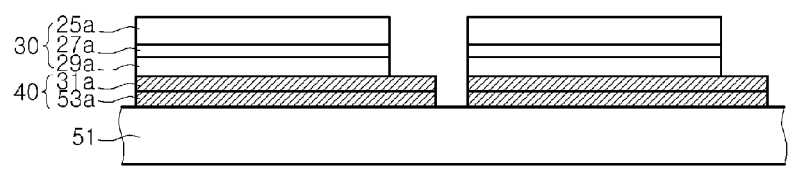
Figure 4:
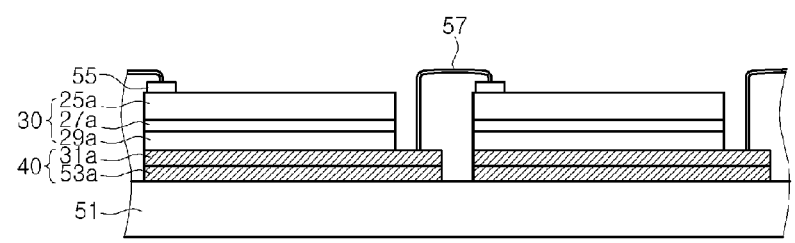

The present invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being formed or disposed "on" another element, it can be disposed directly on the other element, or intervening elements may also be present. In contrast, when an element is referred to as being formed or disposed "directly on" another element, there are no intervening elements present. In addition, when an element is referred to as being connected to another element, it can be directly connected to the other element, or it may be indirectly connected to the other element, via intervening elements. In contrast, when an element is referred to as being directly connected to another element, no intervening elements are present therebetween.

Figure 5:
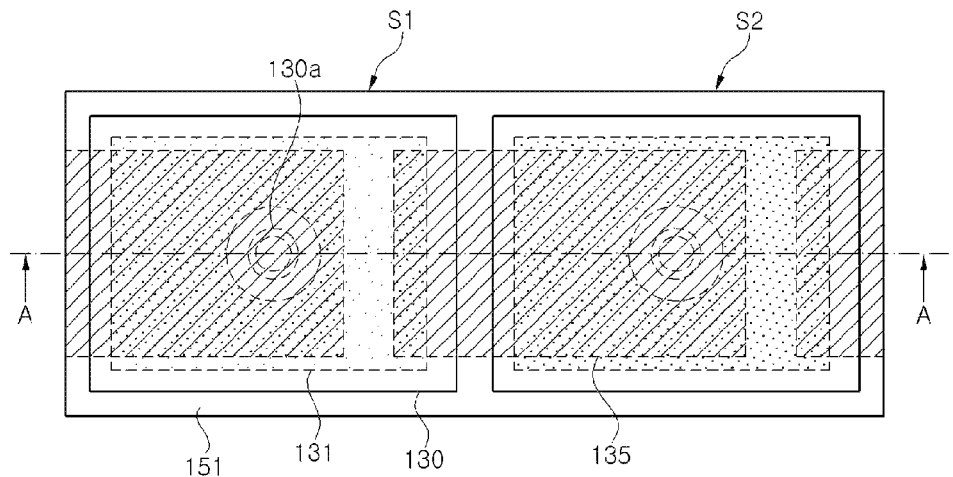
FIG. 5 is a schematic plan view of a light emitting device, according to one exemplary embodiment of the present invention.
Figure 6:
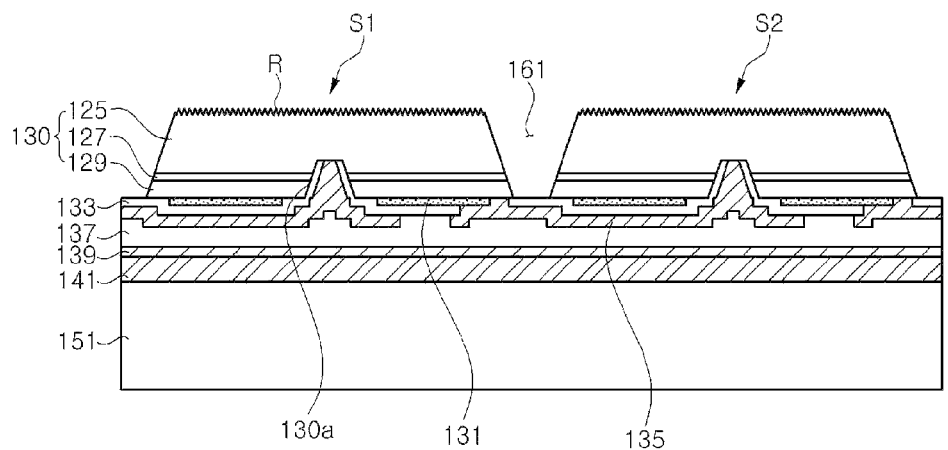
FIG. 6 is a cross-sectional view taken along line A-A in FIG. 5.

FIG. 5 is a schematic plan view of a light emitting device, according to one exemplary embodiment of the present invention, and FIG. 6 is a cross-sectional view taken along line A-A in FIG. 5. Referring to FIGS. 5 and 6, the light emitting device includes a substrate 151, a first light emitting cell S1, a second light emitting cell S2, an isolation trench 161, and connectors 135. Further, the light emitting device may include holes 130a, an ohmic contact layer 131, an insulation layer 133, an isolation insulation layer 137, an adhesion layer 139, and a bonding metal 141. In some embodiments, the light emitting device may further include a protective insulation layer (not shown).

The substrate 151 is distinguished from a growth substrate for growing compound semiconductors and is a substrate to be attached to compound semiconductors that have been already grown. The substrate 151 may be a sapphire substrate, but is not limited thereto. Alternatively, the substrate 151 may be a different kind of insulation, or conductive, substrate. In particular, when using a sapphire substrate as the growth substrate for semiconductors, it is generally desirable that the substrate 151 be a sapphire substrate, so as to have the same thermal expansion coefficient as the growth substrate.

The light emitting cells S1, S2 are isolated from each other by the isolation trench 161. Each of the light emitting cells S1, S2 includes a semiconductor stack 130, which includes a first (upper) semiconductor layer 125, an active layer 127, and a second (lower) semiconductor layer 129. The active layer 127 is interposed between the first semiconductor layer 125 and the second semiconductor layer 129. Each of the light emitting cells S1, S2 includes a hole 130a formed through the second semiconductor layer 129 and the active layer 127, to expose a portion of the first semiconductor layer 125. The holes 130a are located at central regions of the light emitting cells S1, S2, respectively. Each of the light emitting cells S1, S2 may include a single hole 130a, but the present invention is not limited thereto. For example, each of the light emitting cells S1, S2 may include a plurality of the holes 130a.

The active layer 127 and the first and second semiconductor layers 125, 129 may be formed of III-N-based compound semiconductors, for example, (Al, Ga, In)N semiconductors. Each of the first and second semiconductor layers 125, 129 may include a single layer or multiple layers. In some embodiments, the first and/or second semiconductor layers 125, 129 may include a contact layer and a cladding layer. In other embodiments, the first and/or second semiconductor layers 125, 129 may further include a super lattice layer. The active layer 127 may have a single quantum well structure or a multi-quantum well structure. In some embodiments, the first semiconductor layer 125 is an n-type layer, and the second semiconductor layer 129 is a p-type layer. Since the first semiconductor layers 125 may be n-type semiconductor layers, which have a relatively low resistance, it is possible to form the first semiconductor layers 125 to a relatively large thickness. Accordingly, a roughened surface R can be easily formed on an upper surface of the first semiconductor layers 125, thereby enhancing the extraction efficiency of light produced in the active layer 127.

The isolation trenches 161 are formed through the first semiconductor layer 125, active layer 127, and second semiconductor layer 129, so that inner walls of the isolation trenches 161 are formed by the semiconductor stack 130.

Since all of the isolation trenches 161 may be formed with the same depth, an etching process for forming the isolation trenches 161 may be stably performed.

The connectors 135 are located between the light emitting cells S1, S2 and the substrate 151, to electrically connect the light emitting cells S1, S2 to each other. The connectors 135 provide an electrical connection between light emitting cells. Specifically, the connectors are each electrically connected to the first semiconductor layer 125 of one light emitting cell and are connected to the second semiconductor layer 129 of another one of the light emitting cells. Further, each of the connectors 135 electrically connects adjacent light emitting cells to each other. For example, the connector 135 electrically connects the second semiconductor layer 129 of the first light emitting cell S1 to the first semiconductor layer 125 of the second light emitting cell S2. Here, the connector 135 may be electrically connected to the portion of the first semiconductor layer 125 exposed through the hole 130a of the second light emitting cell. Specifically, the connector 135 may extend from second semiconductor layer 129 of the first light emitting cell S1, across the substrate 151, and through the second semiconductor layer 129 and active layer 127 of the second light emitting cell S2, so as to contact the first semiconductor layer 125 of the second light emitting cell S2. According to some embodiments, the portion of the connector 135 that extends into the second light emitting cell S2 may be cone-shaped, with the tip of the cone contacting the first semiconductor layer 125. However, this portion of the connector 135 is not limited to any particular shape.

As such, a plurality of light emitting cells may be connected in series to one another, via the connectors 135, to form a series array of the light emitting cells. Thus, the light emitting device can be operated at a high voltage. Further, a plurality of series arrays may be provided and connected in reverse parallel to one another, thereby providing an AC light emitting device, which can be operated by an AC power source.

The ohmic contact layer 131 may contact to the second semiconductor layer 129. The ohmic contact layer 131 contacts most of the lower surface of the second semiconductor layer 129, to facilitate current spreading in the light emitting cells S1, S2. The ohmic contact layer 131 may include a reflective metal layer and thus, may reflect light radiated from the light emitting cells S1, S2, away from the substrate 151. Here, the connector 135 electrically connected to the second semiconductor layer 129 of the first light emitting cell S1 may be connected to the ohmic contact layer 131 disposed under the light emitting cell S1. The connector 135 is insulated from the second semiconductor layer 129 and the ohmic contact layer 131, of the second light emitting cell S2, while being electrically connected to the first semiconductor layer 125 of the second light emitting cell S2.

The insulation layer 133 is interposed between the isolation trench 161 and the connector 135, to prevent the connector 135 from being exposed to the outside. Therefore, while the isolation trench 161 is being formed by etching, it is possible to protect the connectors from etching damage.

The insulation layer 133 is located on a sidewall (inside) of the holes 130a, to prevent the connectors 135 from short circuiting the first and second semiconductor layers 125, 129. Further, the insulation layer 133 is interposed between the ohmic contact layer 131 and the connectors 135, to insulate the ohmic contact layer 131 and the connectors 135 from each other.

In this embodiment, the insulation layer on the holes 130a, the insulation layer for preventing etching damage, and the insulation layer on the ohmic contact layer 131 may be formed as a single insulation layer 133 and may include a distribution Bragg reflector (DBR). Alternatively, these insulation layers may be separately formed by different processes.

The bonding metal 141 may be interposed between the light emitting cells S1, S2 and the substrate 151. The bonding metal 141 may be formed of metallic materials, for example, Au/Sn, to bond the substrate 151 to the light emitting cells S1, S2. Further, the isolation insulation layer 137 may be interposed between the light emitting cells S1, S2 and the bonding metal 141, to electrically insulate the connectors 135 from the bonding metal 141. In some embodiments, the adhesion layer 139 may be formed of, for example, Cr/Au, and may be formed under the isolation insulation layer 137, to enhance an adhesive force of the bonding metal 141.

The first semiconductor layer 125 may include a roughened surface R. Further, a protective insulation layer (not shown) may cover the light emitting cells S1 and S2, to protect the light emitting cells. The protective insulation layer may fill the isolation trench 161.

Figure 7:
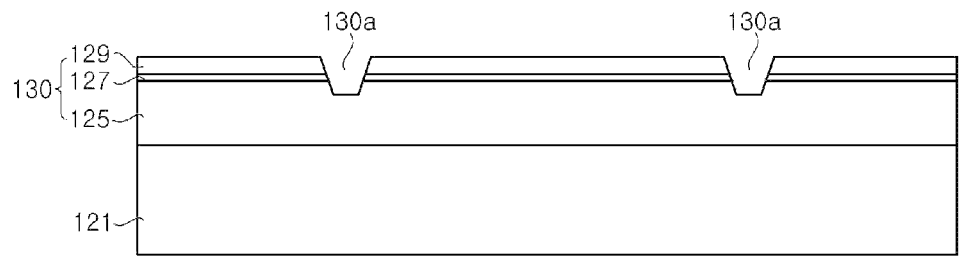
FIGS. 7, 8, 9, 10, 11, and 12 are cross sectional-views illustrating a method of fabricating a light emitting device, according to one exemplary embodiment of the present invention.

FIGS. 7 to 12 are cross-sectional views illustrating a method of fabricating a light emitting device, according to one exemplary embodiment of the present invention. Referring to FIG. 7, a semiconductor stack 130, including compound semiconductor layers, is formed on a sacrificial substrate 121. The sacrificial substrate 121 may be a sapphire substrate, but is not limited thereto. Alternatively, the sacrificial substrate 121 may be a heterogeneous substrate. The compound semiconductor layers may include a first semiconductor layer 125, a second semiconductor layer 129, and an active layer 127 interposed between the first and second semiconductor layers 125, 129. The first semiconductor layer 125 is located closer to the sacrificial substrate 121 than the second semiconductor layer 129. Each of the first and second semiconductor layers 125, 129 may be in the form of a single layer, or may be formed as multiple layers. Further, the active layer 127 may have a single quantum well structure or a multi-quantum well structure.

The compound semiconductor layers 125, 127, 129 may be formed of III-N based compound semiconductors disposed on the sacrificial substrate 121, by metal organic chemical vapor deposition (MOCVD) or molecular beam epitaxy (MBE). A buffer layer (not shown) may be formed before the formation of the compound semiconductor layers 125, 127, 129. The buffer layer is employed to relieve lattice mismatches between the sacrificial substrate 121 and the compound semiconductor layers 125, 127, 129. The buffer layer may be formed of a nitride-based material, such as gallium nitride or aluminum nitride.

Holes 130a are formed to expose the first semiconductor layer 125, by patterning the semiconductor stack 130. The holes 130a are formed at central regions of light emitting cells, to connect connectors to the first semiconductor layer 125. Side surfaces of the active layer 127 and the second semiconductor layer 129 are exposed on inner walls of the holes 130a.

To form the holes 130, the compound semiconductor layers are subjected to patterning by photolithography and etching, which are very similar to a mesa etching process. However, the mesa etching process is generally performed to provide a mesh shape, so as to isolate the second semiconductor layers 129 of the light emitting cells from each other, whereas the holes 130a are separated from each other in various embodiments of the invention. Accordingly, the holes 130a may be reduced in area, to allow an isolation insulation layer and a bonding metal to be easily flattened, so that the substrate 151 can be stably attached to the semiconductor layers.

Figure 8:
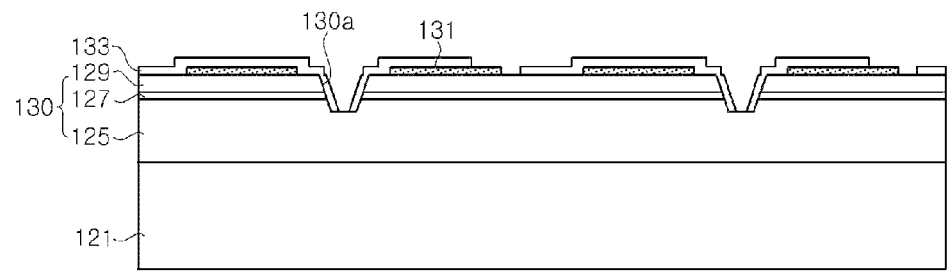

Referring to FIG. 8, an ohmic contact layer 131 may be formed on the second semiconductor layer 129. The ohmic contact layer 131 may form an ohmic contact with the second semiconductor layer 129. The ohmic contact layer 131 is formed on each of the light emitting cells and has an opening that exposes each of the holes 130a. The ohmic contact layer 131 may include a reflective metal layer. In some embodiments, the ohmic contact layer 131 may include a barrier layer to protect the reflective metal layer.

An insulation layer 133 may be formed to cover a sidewall of the holes 130a, while covering a portion of the ohmic contact layer 131. The insulation layer 133 covers a portion of the second semiconductor layer 129 located between the light emitting cells. The portions of the insulation layer 133 covering the sidewalls of the holes 130a, disposed on the ohmic contact layer 131, and located between the light emitting cells may be formed of the same material by the same process. Alternatively, these portions of the insulation layer 133 may be formed by different processes, and/or may be separated from one another. The insulation layer 133 may be formed of, for example, SiO2, SiN, MgO, TaO, TiO2, or a polymer, and may include a distributed Bragg reflector (DBR).

Figure 9:
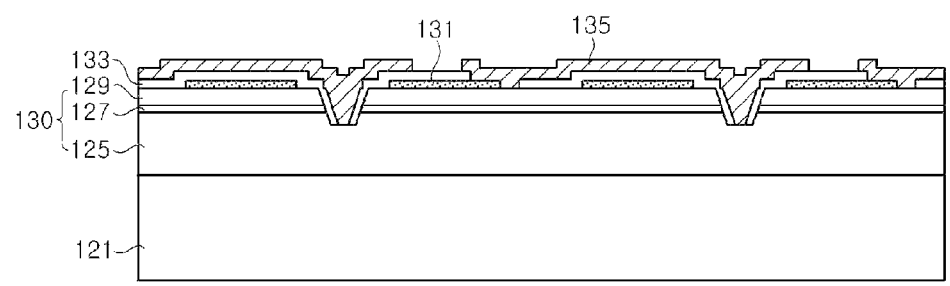

Referring to FIG. 9, connectors 135 are formed on the insulation layer 133. Each of the connectors 135 electrically connects a portion of the first semiconductor layer 125 exposed in the hole 130a, to the second semiconductor layer 129 in an adjacent light emitting cell. The connector 135 that is electrically connected to the second semiconductor layer 129 may be connected to the ohmic contact layer 131. Here, it is desirable that the connector 135 be insulated from the ohmic contact layer 131 and the second semiconductor layer 129, in some regions. To this end, an insulation layer 133 is interposed between the connector 135 and the ohmic contact layer 131, in such regions.

Figure 10:
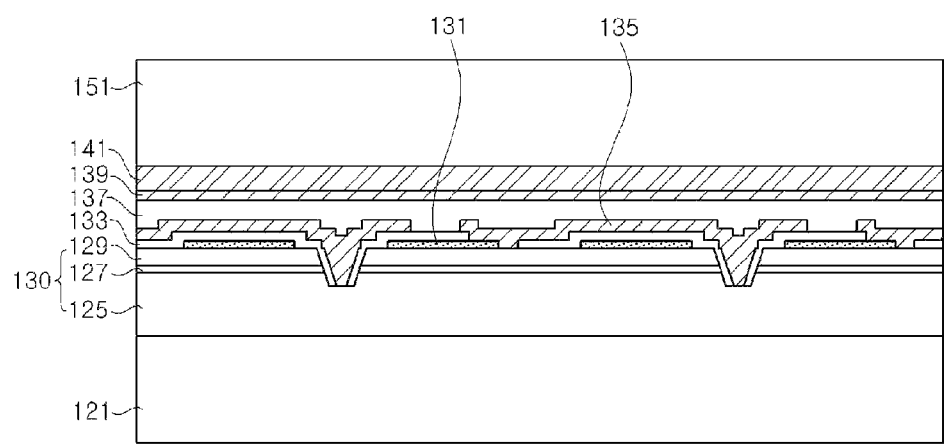

Referring to FIG. 10, an isolation insulation layer 137 is formed to substantially cover a surface of the sacrificial substrate 121, on which the connectors 135 are formed. The isolation insulation layer 137 may completely cover lower surfaces of the connectors 135 and the insulation layer 133. The isolation insulation layer 137 may be formed of a silicon oxide film, a silicon nitride film, or the like. Further, the isolation insulation layer 137 may be a DBR with SiO2/TiO2 periodically formed therein. An adhesion layer 139 may be formed on the isolation insulation layer 137, and a bonding metal 141 may be formed on the adhesion layer 139. Then, the substrate 151 may be bonded to the bonding metal 141. The bonding metal 141 may be formed of, for example, AuSn (80/20 wt %). The substrate 151 may have the same thermal expansion coefficient as the sacrificial substrate 121. In some embodiments, the substrate 151 may be a sapphire substrate, but is not limited thereto.

Figure 11:
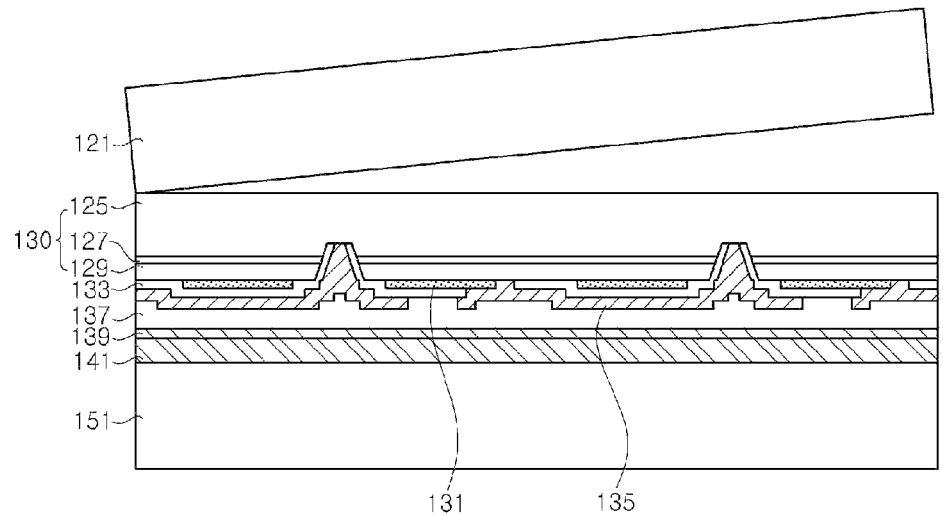

Referring to FIG. 11, the sacrificial substrate 121 is then removed to expose the first semiconductor layer 125. The sacrificial substrate 121 may be removed via laser lift-off (LLO) or other mechanical or chemical techniques. Here, the buffer layer is also removed to expose the first semiconductor layer 125.

Figure 12:
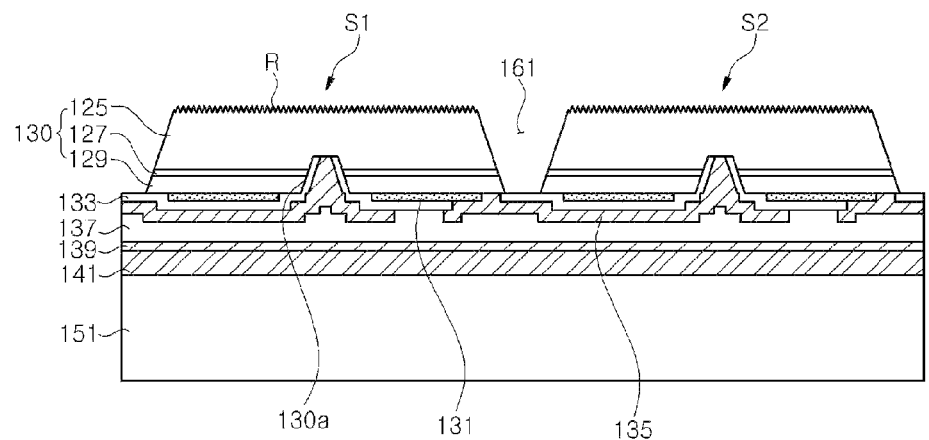

Referring to FIG. 12, an isolation trench 161 is formed to divide the semiconductor stack 130 into light emitting cells S1, S2. The isolation trench 161 is formed by etching the semiconductor stack 130 until the insulation layer 133 is exposed. Here, the insulation layer 133 prevents the connectors 135 from being exposed. A sidewall of the isolation trench 161 is formed of the semiconductor stack 130, and the side surfaces of the first semiconductor layer 125, active layer 127, and second semiconductor layer 129 are exposed in the isolation trench. A roughened surface R may be formed on the first semiconductor layer 125, by a photo-enhanced chemical (PEC) etching or the like.

Then, a protective insulation layer (not shown) and electrode pads (not shown) are formed on the first semiconductor layers 125. The substrate 151 is divided into light emitting device units, each including the light emitting cells S1, S2, thereby providing a single chip light emitting device.

Figure 13:
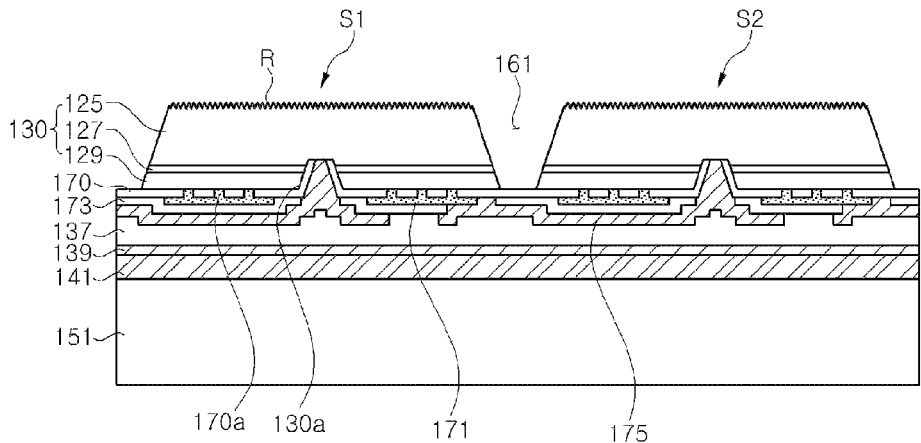
FIG. 13 is a cross-sectional view of a light emitting device, according to another exemplary embodiment of the present invention.

FIG. 13 is a cross-sectional view of a light emitting device, according to another exemplary embodiment of the present invention. Referring to FIG. 13, the light emitting device according to this embodiment has a similar structure to the light emitting device described with reference to FIGS. 5 and 6, so only the differences there between will be described in detail. In particular, the light emitting device of FIG. 13 includes a DBR 170 and an ohmic contact layer 171.

The DBR 170 is interposed between the ohmic contact layer 171 and a second semiconductor layer 129. The DBR 170 may cover the sidewalls of holes 130a formed in the second semiconductor layer 120. The DBR 170 may be interposed between an isolation trench 161 and a connector 175.

The DBR 170 may include through-holes 170a disposed between the ohmic contact layer 171 and the second semiconductor layer 129. The ohmic contact layer 171 may be connected to the second semiconductor layer 129, through the through-holes 170a. The DBR 170 is formed on the sidewalls (inside) of the holes 130a, between the ohmic contact layer 171 and the semiconductor layer 129, and on between the isolation trench 161 and the connector 175. The DBR 170 improves the reflection of light produced in the light emitting cells S1, S2 and thus, improves luminous efficiency.

An insulation layer 173 is formed on regions of the ohmic contact layer 171. The insulation layer 173 electrically insulates the connector 175 from the ohmic contact layer 171

Although the aspects of the present invention have been illustrated with reference to various exemplary embodiments, it will be apparent to those skilled in the art that various modifications can be made to the exemplary embodiments, without departing from the spirit and scope of the invention. Therefore, it should be understood that the exemplary embodiments are provided by way of illustration only and are given to provide a complete disclosure of the invention and a thorough understanding of the invention to those skilled in the art. Thus, the present invention is intended to cover the various modifications, provided they come within the scope of the appended claims and their equivalents.

What is claimed is:

1. A light-emitting device, comprising:
   a substrate; and
   a first light-emitting diode arranged on the substrate, the first light-emitting diode comprising:
   a first inclined surface comprising an outside surface of the first light-emitting diode;
   a second inclined surface comprising an inside surface of hole in the first light-emitting diode; and
   a roughened surface comprising an upper part of the first light-emitting diode,
   wherein the length of the second inclined surface is less than the length of the first inclined surface.

2. The light-emitting device of claim 1, wherein the hole of the first light-emitting diode is arranged at a central region of the first light-emitting diode.

3. The light-emitting device of claim 1, wherein the roughened surface comprises a third inclined surface of the first light-emitting diode.

4. The light-emitting device of claim 1, wherein the first light-emitting diode further comprises:

a first-type semiconductor layer;
a second-type semiconductor layer; and
an active layer arranged between the first-type semiconductor layer and the second-type semiconductor layer,
wherein a portion of the first-type semiconductor layer and the active layer are removed, and a portion of the second-type semiconductor layer is exposed.

5. The light-emitting device of claim 4, further comprising:
a first electrode contacting the first-type semiconductor layer and the substrate; and
a second electrode contacting the exposed portion of the second-type semiconductor layer and the substrate.

6. The light-emitting device of claim 5, wherein a first portion of the first electrode and a first portion of the second electrode are arranged at the same depth in the substrate, and the first electrode and the second electrode are spaced apart from each other.

7. The light-emitting device of claim 5, wherein the first electrode comprises a reflector layer and a barrier layer.

8. The light-emitting device of claim 5, further comprising a second light-emitting diode serially connected to the first light-emitting diode.

9. The light-emitting device of claim 8, wherein a first end of the second electrode contacts the second-type semiconductor layer of the first light-emitting diode, and a second end of the second electrode contacts the first-type semiconductor layer of the second light-emitting diode.

10. The light-emitting device of claim 5, further comprising:
a first insulation layer arranged between the first electrode and the second electrode; and
a second insulation layer arranged between a side surface of first-type semiconductor layer and the second electrode.

11. The light-emitting device of claim 10, wherein the second insulation layer comprises a plurality of holes, and the first electrode and the second electrode respectively contact the first-type semiconductor layer and the second-type semiconductor layer through the holes.

12. The light-emitting device of claim 10, wherein the first insulation layer comprises a stack of at least two different oxide insulation layers.

13. A light-emitting device, comprising:
a substrate; and
a first light-emitting diode arranged on the substrate, the first light-emitting diode comprising:
a first inclined surface comprising an outside surface of the first light-emitting diode;
a second inclined surface comprising an inside surface of hole in the first light-emitting diode;
a roughened surface comprising an upper part of the first light-emitting diode,
wherein the length of the second inclined surface is less than the length of the first inclined surface;
a first-type semiconductor layer;
a second-type semiconductor layer; and
an active layer arranged between the first-type semiconductor layer and the second-type semiconductor layer,
wherein a portion of the first-type semiconductor layer and the active layer are removed, and a portion of the second-type semiconductor layer is exposed;
a first electrode contacting the first-type semiconductor layer and the substrate;
a second electrode contacting the exposed portion of the second-type semiconductor layer and the substrate;
a first insulation layer arranged between the first electrode and the second electrode; and
a second insulation layer arranged between a side surface of first-type semiconductor layer and the second electrode,
wherein a first portion of the first electrode and a first portion of the second electrode are arranged at the same depth in the substrate, and the first electrode and the second electrode are spaced apart from each other.

14. The light-emitting device of claim 13, wherein the second insulation layer comprises a plurality of holes, and the first electrode and the second electrode respectively contact the first-type semiconductor layer and the second-type semiconductor layer through the holes.

15. The light-emitting device of claim 13, wherein the first insulation layer comprises a stack of at least two different oxide insulation layers.

16. The light-emitting device of claim 13, wherein the first electrode comprises a reflector layer and a barrier layer.

17. The light-emitting device of claim 13, wherein the hole of the first light-emitting diode is arranged at a central region of the first light-emitting diode.

18. The light-emitting device of claim 13, wherein the roughened surface comprises a third inclined surface of the first light-emitting diode.

19. The light-emitting device of claim 13, further comprising a second light-emitting diode serially connected to the first light-emitting diode.

20. The light-emitting device of claim 19, wherein a first end of the second electrode contacts the second-type semiconductor layer of the first light-emitting diode, and a second end of the second electrode contacts the first-type semiconductor layer of the second light-emitting diode.

* * * * *